(12) United States Patent
Chan et al.

(10) Patent No.: US 11,545,401 B2
(45) Date of Patent: Jan. 3, 2023

(54) ISOLATED SEMICONDUCTOR LAYER STACKS FOR A SEMICONDUCTOR DEVICE

(71) Applicant: IMEC vzw, Leuven (BE)

(72) Inventors: Boon Teik Chan, Wilsele (BE);
Eugenio Dentoni Litta, Leuven (BE);
Liping Zhang, Heverlee (BE)

(73) Assignee: IMEC vzw, Leuven (BE)

(*) Notice: Subject to any disclaimer, the term of this patent is extended or adjusted under 35 U.S.C. 154(b) by 76 days.

(21) Appl. No.: 17/114,826

(22) Filed: Dec. 8, 2020

(65) Prior Publication Data
US 2021/0175130 A1 Jun. 10, 2021

(30) Foreign Application Priority Data
Dec. 9, 2019 (EP) .................................. 19214527

(51) Int. Cl.
| H01L 21/8238 | (2006.01) |
| H01L 29/66 | (2006.01) |
| H01L 29/06 | (2006.01) |
| H01L 29/423 | (2006.01) |

(52) U.S. Cl.
CPC ............ *H01L 21/823878* (2013.01); *H01L 21/823828* (2013.01); *H01L 29/0665* (2013.01); *H01L 29/42392* (2013.01); *H01L 29/66742* (2013.01)

(58) Field of Classification Search
CPC ..... H01L 21/823878; H01L 21/823828; H01L 29/0665; H01L 29/42392; H01L 29/66742; H01L 21/76264; H01L 29/0653; H01L 29/66772; H01L 29/78654; H01L 29/78684; H01L 29/78696; H01L 29/66439; H01L 29/775; H01L 29/0673; H01L 21/76224; B82Y 10/00
USPC ......................................... 438/151
See application file for complete search history.

(56) References Cited

U.S. PATENT DOCUMENTS

| 10,276,452 | B1* | 4/2019 | Seshadri ........... H01L 21/28185 |
| 10,332,803 | B1 | 6/2019 | Xie et al. |
| 10,461,154 | B1 | 10/2019 | Song et al. |
| 2019/0288117 | A1 | 9/2019 | Xie et al. |
| 2019/0296151 | A1 | 9/2019 | Leobandung |
| 2020/0152734 | A1* | 5/2020 | Frougier ............. H01L 29/0649 |
| 2021/0119031 | A1* | 4/2021 | Song .................... H01L 29/785 |

OTHER PUBLICATIONS

Extended European Search Report dated May 29, 2020 in counterpart European Application No. 19214527.4 in 9 pages.

* cited by examiner

*Primary Examiner* — Tong-Ho Kim
(74) *Attorney, Agent, or Firm* — Knobbe, Martens, Olson & Bear, LLP

(57) ABSTRACT

In one aspect, a method of forming a semiconducting device can comprise forming, on a substrate surface, a stack comprising semiconductor material sheets and a bottom semiconductor nanosheet; forming a trench through the stack vertically down through the bottom semiconductor nanosheet, thereby separating the stack into two substacks; selectively removing the bottom semiconductor nanosheet, thereby forming a bottom space extending under the substacks; and filling the bottom space and the trench with a dielectric material to provide a bottom isolation and formation of a dielectric wall between the substacks.

20 Claims, 10 Drawing Sheets

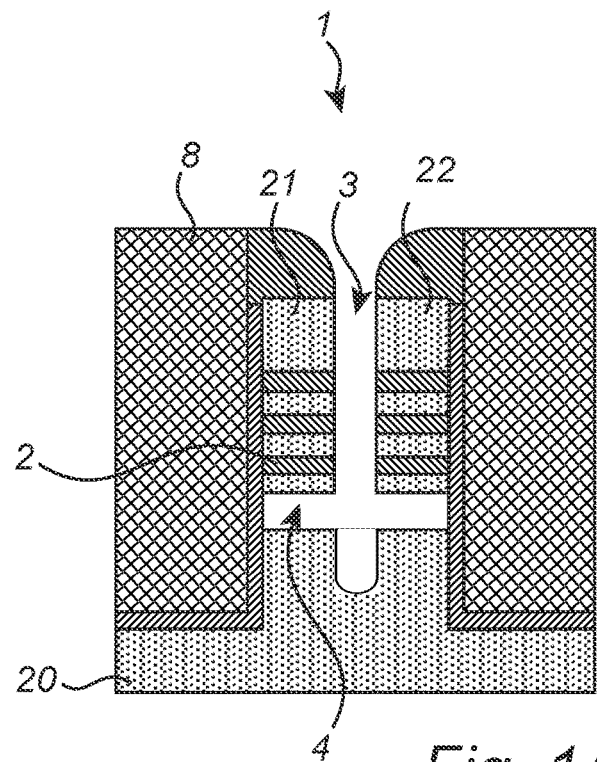
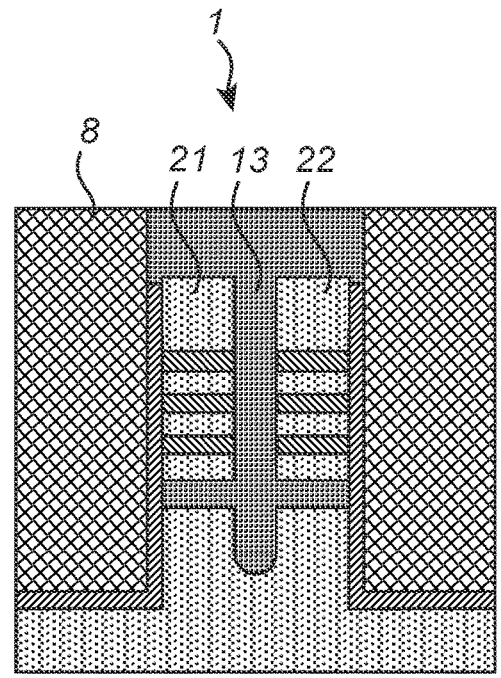
Fig. 1A  Fig. 1B
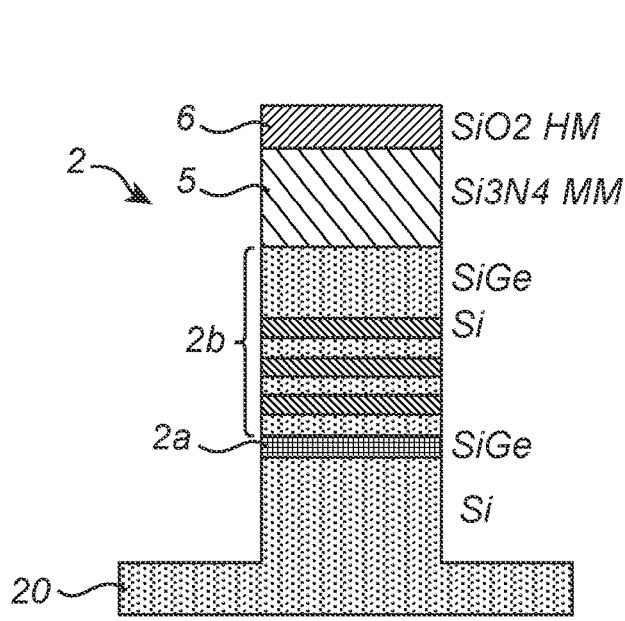
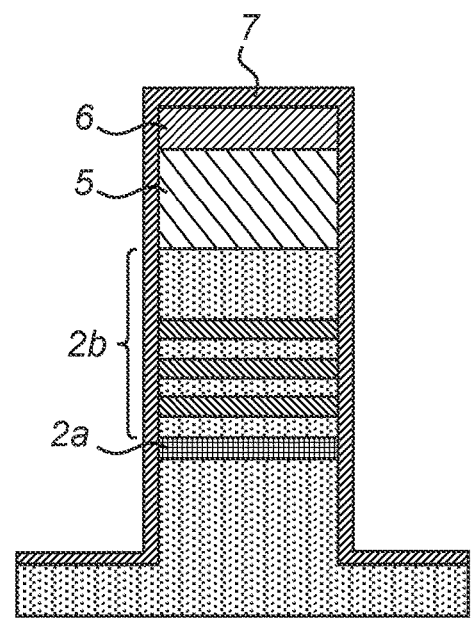
Fig. 2A  Fig. 2B

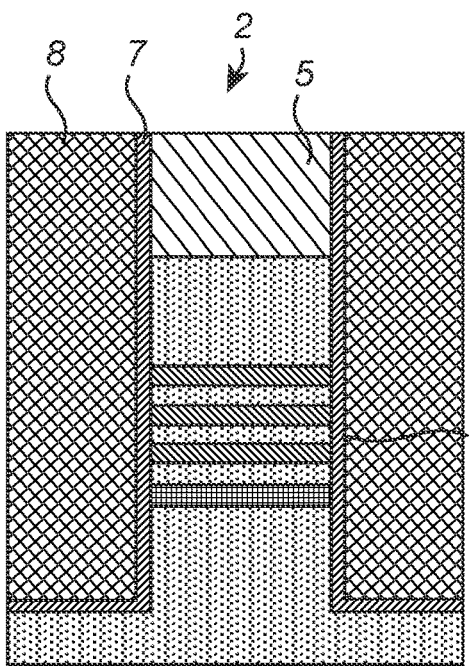 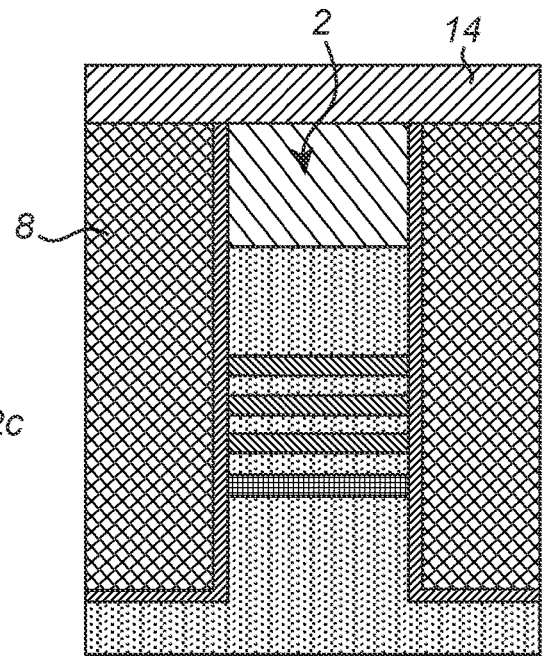
Fig. 2C    Fig. 2D
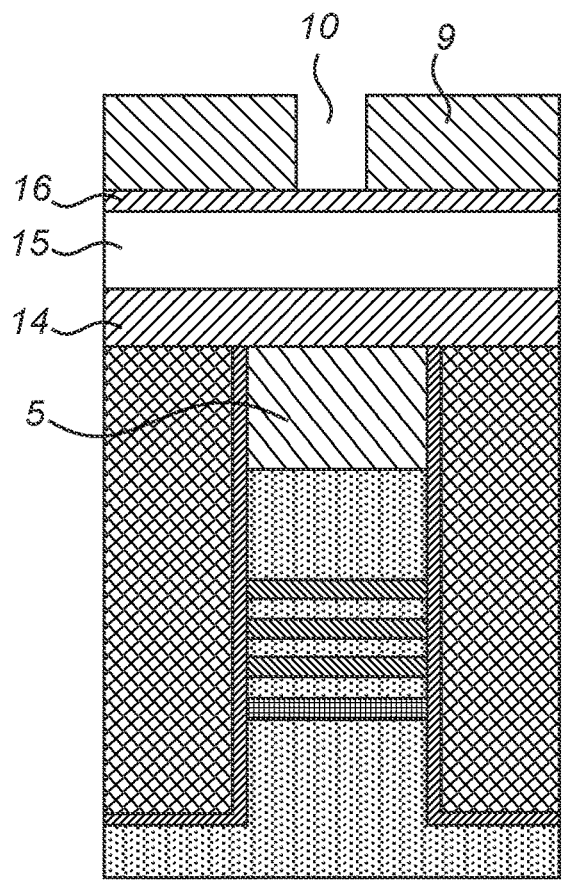 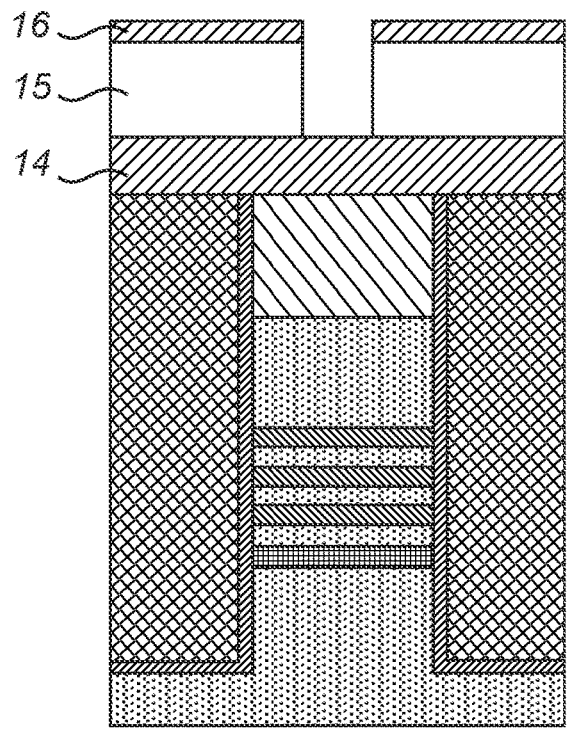
Fig. 2E    Fig. 2F

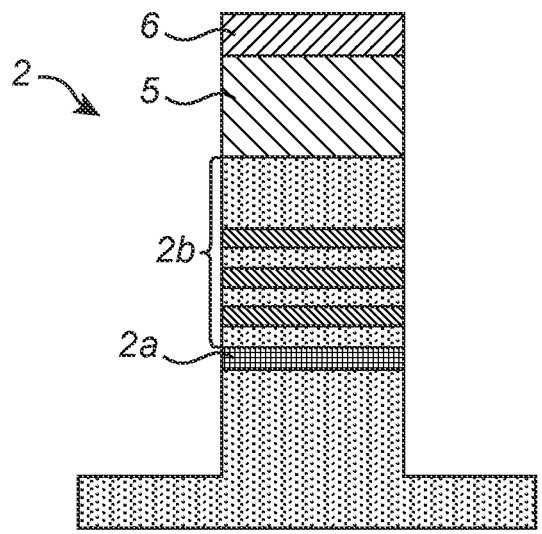
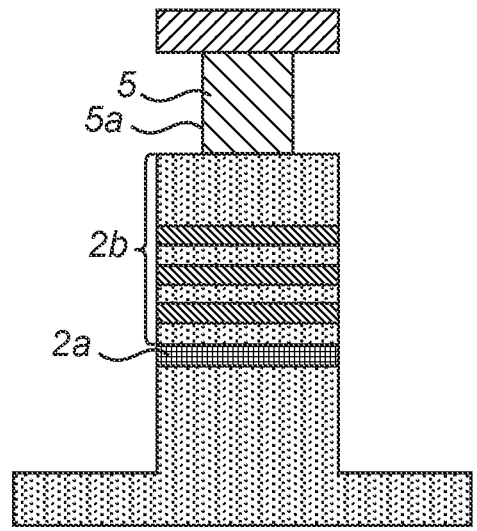
Fig. 4A      Fig. 4B
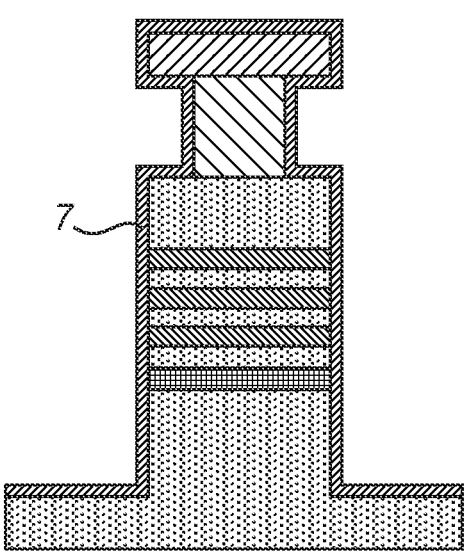
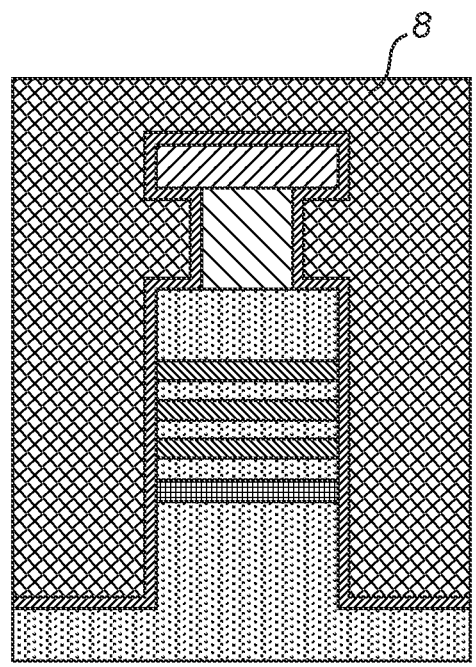
Fig. 4C      Fig. 4D

ISOLATED SEMICONDUCTOR LAYER STACKS FOR A SEMICONDUCTOR DEVICE

CROSS-REFERENCE TO RELATED APPLICATIONS

This application claims foreign priority to European Patent Application No. EP 19214527.4, filed Dec. 9, 2019, the content of which is incorporated by reference herein in its entirety.

BACKGROUND

Technical Field

The disclosed technology generally relates to the field of semiconductor devices and more particularly to isolated semiconductor layer stacks for a semiconductor device such as a field-effect transistor (FET) device comprising stacked nanosheets.

Description of the Related Technology

In striving to provide more power- and area-efficient circuit designs, new transistor devices are being developed.

Horizontal channel field effect transistor (FET) devices include the fin field-effect transistor (finFET), which can have a gate straddling a channel portion of a fin-shaped semiconductor structure, and the horizontal nanowire- or nanosheet-FET (horizontal NWFET or NSFET), which can have a gate at least partly enclosing a channel portion of a horizontally oriented nanowire- or nanosheet-shaped semiconductor structure.

Efficient process flows dedicated to fabrication of horizontal channel FET devices have been developed. However, individual horizontal channel field effect transistors may be positioned close to each other to have area-efficient design, and there may thus be a challenge to efficiently isolate adjacent transistors from each other and to form a bottom isolation. Thus, there is a desire in the art for improved methods of forming and isolating semiconductor devices.

SUMMARY OF CERTAIN INVENTIVE ASPECTS

An objective of the disclosed technology is to at least partly overcome one or more limitations of the prior art. In particular, it is an objective to provide a method allowing for an efficient isolation of semiconductor devices formed on a common substrate.

As one aspect of the disclosed technology, a method of forming a semiconducting device can comprise:
a) forming, on a substrate surface, a stack comprising semiconductor material sheets and a bottom semiconductor nanosheet;
b) forming a trench through the stack vertically down through the bottom semiconductor nanosheet, thereby separating the stack into two substacks;
c) selectively removing at least a part of the bottom semiconductor nanosheet, thereby forming a bottom space extending under the substacks; and
d) filling the bottom space and the trench with dielectric material to provide a bottom isolation and formation of a dielectric wall between the substacks.

As used herein, vertical may refer to a direction being parallel to a vertical geometrical axis extending perpendicular to the substrate. The terms "above", "below", "upper", "top", "lower", or "bottom" can refer to relative positions along the vertical axis, and do not imply an absolute orientation of the substrate or device. In addition, lateral or horizontal may refer to the direction perpendicular to the vertical direction, e.g., to the direction parallel to the substrate surface.

One aspect of the disclosed technology is based on the insight that the isolation between individual substacks of nanosheets, e.g., forming a dielectric "wall" between substacks of nanosheets, can be performed simultaneously as providing the bottom isolation. Thus, both bottom and wall isolation may be filled with the same dielectric material in some implementations.

The bottom isolation, e.g., the isolation filling the bottom space, can separate the substacks of nanosheets from the substrate.

The substrate surface may be the surface of a semiconductor material, such as a single crystalline, polycrystalline or amorphous semiconductor material. As an example, the substrate may be single crystalline silicon.

The stack can comprise stacked horizontally extending nanosheets and may be used to form horizontal channel FET devices, e.g., devices comprising a semiconductor structure comprising a first and a second source/drain portion and a channel portion located intermediate and extending horizontally between the first and second source/drain portions, and further comprising a gate structure extending horizontally along the channel portion. In a horizontal channel FET device, the first and second source/drain portions and the channel portion may intersect a common horizontal plane. The channel portion can be adapted to (in use of the device) conduct a horizontally oriented flow of charge carriers between the source/drains.

The semiconductor material sheets of the stack formed in step a) may be arranged to be used as channels in a formed horizontal channel FET device.

The bottom semiconductor nanosheet may be arranged on the substrate surface. In some instances, there may be intermediate layers other than stacked nanosheets between the substrate surface and the bottom semiconductor nanosheet.

The bottom semiconductor nanosheet may comprise silicon germanium (SiGe). The other semiconductor nanosheets of the stack may be of a material such that the bottom semiconductor nanosheet can be selectively removed from the other sheets during step c).

In some embodiments, the bottom semiconductor nanosheet can comprise SiGe having a Ge content of over 50%, e.g., $Si_{1-x}Ge_x$, in which x>0.5. As an example, the bottom semiconductor nanosheet may be a $Si_{0.35}Ge_{0.65}$ nanosheet.

Moreover, the other semiconductor nanosheets of the stack can comprise SiGe sheets having a Ge content of below 40%.

$Si_{1-x}Ge_x$ nanosheets, in which x>0.5, may be selectively removed from other $Si_{1-x}Ge_x$ nanosheets, in which x<0.4 during step c) of the method of some implementations. These materials may allow selectively removing of the bottom semiconductor nanosheet, e.g., after forming the trench, thereby allowing for filling (e.g., simultaneous filling in various instances) of dielectric material (e.g., the same dielectric material in some instances) in the trench and in the bottom space extending under the substacks formed when forming the trench.

The formation of the trench in step b) may be a straight etch through the stack, for example, using anisotropic etching, e.g., orientation dependent etching, of an exposed upper lateral surface area of the stack.

The stack provided in step a) may be in the form of fins that are cut into two individual substacks by the trench in step b).

In some embodiments, the stack formed in step a) can comprise an upper insulator layer above the semiconductor material sheets. Such an upper insulator layer may in some instances, originate from the patterning of the stack, e.g., from the patterning of the fins. The upper insulator layer may be a hardener. As an example, the upper insulator layer may comprise silicon nitride ($Si_3N_4$). The upper insulator layer may thus be a hardmask, e.g., used as a chemical mechanical polishing (CMP) stopping layer.

In some implementations, the stack formed in step a) may further comprise a top oxide layer. Such a top oxide layer may originate from the formation of the stacked nanosheets in some instances. As an example, the top oxide layer may be hardmask during a lithographic patterning of the stacks on the substrate surface. The top oxide layer may comprise or consist of silicon dioxide ($SiO_2$).

The method may comprise the deposition of a shallow trench isolation (STI) oxide such that the semiconductor nanosheets are attached to this STI oxide during the removal of the bottom semiconductor nanosheet in step c). Such an STI oxide may thus be deposited before step c). The STI oxide may for example be silicon dioxide.

In some embodiments, step a) further can comprise lining the stack with an insulator material and depositing an STI oxide (e.g., conformally in some instances) to the lined sidewalls of the stack, such that the stack is held together by the STI oxide during step c).

The lining of the insulator material may be performed using atomic layer deposition (ALD) in some implementations. The lining may comprise a deposition of an insulator material on the sidewalls and on top of the stack, such as on top of the top oxide layer. The insulator material used as lining may for example be the same as the upper insulator layer. As an example, the insulator material may be $Si_3N_4$. Lining the stack with an insulator layer may decrease the risk of or prevent oxidation. As an example, the insulator liner may prevent oxidation on SiGe, e.g., during flowable chemical vapor deposition (FCVD) oxide annealing.

Depositing of the STI oxide may be performed using chemical vapor deposition (CVD), such as FCVD in some instances. This STI oxide may support the nanosheets during the formation of the trench and during the selective removal of the bottom semiconductor nanosheet.

After deposition of the STI oxide, the semiconductor structure may be planarized, e.g., the height may be reduced. As an example, the planarization may remove the top oxide layer.

Forming the trench in step b) may be performed using different approaches.

In some embodiments, step b) can comprise the steps of
b11) planarizing the formed structure after STI oxide deposition such that the upper insulator layer above the semiconductor material sheets is the uppermost layer of the stack;
b12) forming a patterned photoresist layer over the upper insulator layer such that an opening in the photoresist layer is positioned vertically over the stack; and
b13) forming a trench through the stack vertically down through the bottom semiconductor nanosheet at the position of the opening, thereby separating the stack into two substacks.

In some implementations, forming the trench of step b) may include lithography and etching.

The planarizing in step b11) may be performed using chemical mechanical polishing (CMP).

Step b12) may include forming a hardmask on the planarized structure and depositing a first sacrificial layer such as a spin-on-carbon (SOC) layer, and a second sacrificial layer, such as a spin-on-glass (SOG) layer. Thereafter a photoresist layer may be formed and patterned, using a pattern of irradiation. The photoresist layer may comprise a hardmask.

Etching may be performed at the areas exposed in the pattern in various implementations. The vertical opening of step b) may include etching processes, such as a straight etch process through vertically down through the stack and the bottom semiconductor nanosheet at the position of the opening formed after lithography.

In some embodiments, step b) can comprise
b21) planarizing the formed structure after STI oxide deposition such that the upper insulator layer above the semiconductor material sheets is the uppermost layer of the stack;
b22) removing the upper insulator layer such that the deposited STI oxide forms vertically extending sidewalls at the side of the stack;
b23) depositing spacer material over the stack and at the vertically extending sidewalls, thereby defining a horizontal gap over the stack; and
b24) forming a trench through the stack vertically down through the bottom semiconductor nanosheet at the position of the horizontal gap, thereby separating the stack into two substacks.

In various implementations, the trench may be formed without using lithography. In some embodiments, the trench formed in the stack is "self-aligned", which can also refer to the subsequently formed dielectric wall between the substacks being self-aligned.

The planarizing of step b21) may for example be performed using chemical mechanical polishing (CMP).

The removal of the upper insulator layer in step b22) may be performed using an acid, such as phosphoric acid ($H_3PO_4$) in some implementations. The upper insulator layer may be removed early in the process, e.g., before formation of the trench. After removal of the upper insulator layer, the deposited STI can form vertically extending portions extending over the stack The vertically extending portions may extend all around the stack in some instances, thereby forming a continuous vertically extending portion around the stack. The vertically extending portions may also be formed so that they extend on two opposite sides of the stack, as seen in a cross-section through the stack.

The height above the stack of the vertically extending portions may be lower than the horizontal width of the stack.

Examples of deposition processes that can be used in depositing the spacer material include, for example, CVD, physical vapor deposition (PVD), plasma enhanced chemical vapor deposition (PECVD), atomic layer deposition (ALD), or plasma enhanced atomic layer deposition (PEALD). The spacer material may for example be an oxide, such as $SiO_2$.

The spacer material can be deposited at vertically extending sidewalls such that a small lateral gap is left between the vertical extending structures. This gap can be positioned vertically over the stack. As an example, the gap may be positioned substantially in the middle of the stack, such that the subsequent etching in the gap in step b24) can divide the stack into two sub stacks of substantially the same size. The depositing of spacer material of step b23) may comprise a first deposition of spacer material, followed by a spacer etch. The spacer etch may include an anisotropic etch to remove spacer material that has been deposited on horizontal surfaces.

An example of etching that may be used for etching the deposited spacer material is reactive-ion etching (RIE).

In some implementations, before performing steps b21) to b24), the upper insulator layer may be trimmed in order to reduce the width of this layer before STI deposition. The lateral distance of the subsequently deposited STI oxide can be shorter over the stack, e.g., after removal of the upper insulator layer in step b22), the vertically extending portion can be arranged closer to each other compared to if no trimming is performed.

In some implementations, step a) may further comprise trimming the sidewalls of the upper insulator layer such that the upper insulator layer can have a width that is smaller than the width of the semiconductor material sheets of the stack, the trimming being performed before lining the stack with an insulator material.

Such a step of trimming may allow for a higher aspect ratio of the subsequently formed dielectric wall between the substacks, e.g., the width of the dielectric wall may be reduced.

In some implementations, the simultaneous filling of the bottom space and the trench in step d) can be performed using the same dielectric material. The dielectric material may comprise a silicon nitride (SiN) based material, a silicon carbon oxide (SiCO)-based material, silicon carbonitride or silicon oxynitride (SiOCN, SiON), or silicon carbide (SiC).

As an example, the dielectric material of step d) may be selected from the group consisting of $Si_3N_4$, SiCO and $SiO_2$. As an example, the dielectric material may be $Si_3N_4$.

In some embodiments, the method further can comprise a step e) of planarizing the isolated substacks of step d).

Such a planarization may be performed using chemical mechanical polishing (CMP).

In some embodiments, the method further can comprise forming gates at least partly around the substacks.

The method may first comprise removing sacrificial layers that are present in the substacks between the semiconductor nanosheets.

The gates may be formed such that they at least partly wrap around the semiconductor nanosheets of the substacks. As an example, gate structures may be formed such that they fully wrap around the released semiconductor nanosheets of the substacks, e.g., the released channel portions. In some instances, the distance between semiconductor nanosheets in the substacks may allow for forming a gate-all-around (GAA) structure, which may reduce the operating voltage of the FET device.

As an example, the gate at least partly around a first substack may be a p-gate and the gate at least partly around a second substack may be an n-gate.

Forming the gates may comprise forming a p-type effective work function metal (WFM), on the first and second substacks. Forming the gates may further comprise selectively removing the p-type WFM from the second substack. An n-type WFM may be formed on the second substack, which may be followed by forming a first gate electrode in contact with the first substack and a second gate electrode in contact with the second substack.

Consequently, the methods of the disclosed technology provide for closer proximity of n-type and p-type semiconductor devices.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

FIGS. 1A and 1B are general illustrations of various intermediate structures of an approach of the disclosed technology of wall formation and bottom isolation.

FIGS. 2A-2K illustrate various intermediate structures of a method according to some embodiments of forming a semiconductor device.

FIGS. 4A-4L illustrate various intermediate structures of a method according to some embodiments of forming a semiconductor device.

DETAILED DESCRIPTION OF CERTAIN ILLUSTRATIVE EMBODIMENTS

Figure 2G:
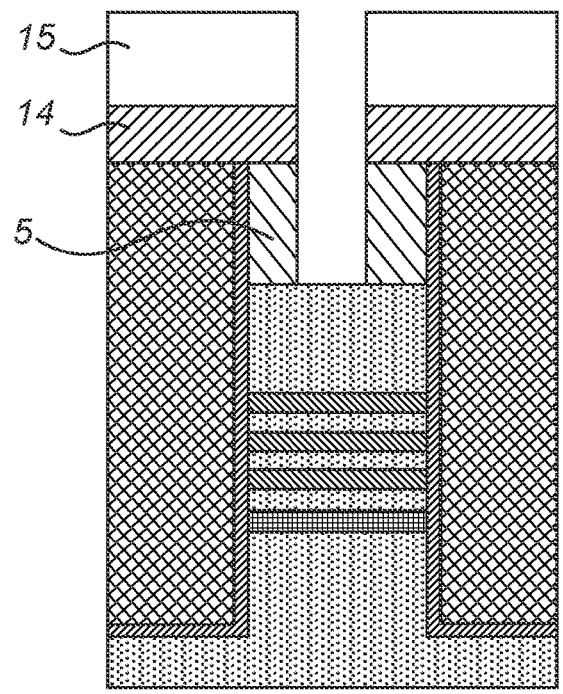

The disclosed technology is mainly being described with reference to a limited number of examples. However, as is readily appreciated by a person skilled in the art, other examples than the ones disclosed herein are equally possible within the scope of the inventive concept, as defined by the appended claims.

FIGS. 1A and 1B show the general approach of the disclosed technology of wall formation and bottom isolation of a semiconductor device 1. As seen in FIG. 1A, the semiconductor device can comprise a stack 2 of horizontally extending nanosheets on a substrate surface 20. The method can comprise a step of forming a trench 3 in the stack, thereby dividing the stack 2 into two substacks 21, 22, and also selectively removing a bottom sheet to create a bottom space 4. During this procedure, the stack may be attached to e.g., an STI oxide 8. Thereafter, as illustrated in FIG. 1B, the trench 3 and the bottom space 4 may be filled (e.g., simultaneously) with dielectric material 13 (e.g., the same dielectric material). In various implementations, the formation of the wall between substacks and the bottom isolation may be performed while using STI oxide to hold the fins of the stack 2, for example, instead of performing the isolation during e.g., subsequent gate patterning.

FIGS. 2A-2K illustrate a method according to some embodiments of forming a semiconductor device according to the disclosed technology.

The method can comprise a step a) of forming a stack 2 of horizontally extending nanosheets on a substrate surface 20 of silicon (Si). The stack 2 can comprise semiconductor material sheets 2b and a bottom semiconductor nanosheet 2a. In some examples, the bottom semiconductor nanosheet 2a is a $Si_{0.35}Ge_{0.65}$ sheet, whereas the other semiconductor nanosheets 2b of the stack 2 comprises SiGe sheets having a Ge content of below 40%.

Between the SiGe sheets in the stack 2b, there may be sheets of a semiconductor material that form the final channel material in the formed semiconductor device. In some implementations, the SiGe sheets may be sacrificial sheets that are subsequently removed. For example, the stack of semiconductor material sheets formed in step a) may comprise alternating SiGe sheets and sheets of another material.

As an example, the channel material of the stack 2b may be Si, and the sacrificial material may be SiGe.

Such a combination of materials may allow for selective removal of the sacrificial material while leaving the channel material.

Alternatively, the channel material of the stack 2b may be silicon germanium (SiGe) and the sacrificial material may be silicon (Si).

Further, the channel material of the stack 2b may be silicon germanium with a first concentration of germanium $Si_{1-x}Ge_x$ and the sacrificial material may be silicon germanium with a second concentration of germanium, different from the first concentration $Si_{1-y}Ge_y$.

Another combination may be germanium (Ge) as the channel material, and silicon germanium (SiGe) as the sacrificial material.

Further, some embodiments may comprise a combination of channel/sacrificial materials wherein one material is from group (or family) III in the periodic table, and the other material is from group (or family) V in the periodic table. For example, the channel material may be from group III, also known as the boron group, which comprises boron (B), aluminum (Al), gallium (Ga), and indium (In). The sacrificial material may be from group V, also known as the nitrogen group or pnictogens, which comprises nitrogen (N), phosphorus (P), arsenic (As), and antimony (Sb). Alternatively, the channel material may be selected from group V and the sacrificial material selected from group III.

Furthermore, the stack 2 formed in step a) can comprise an upper insulator layer 5 above the semiconductor material sheets 2b. This upper insulator layer 5 may for example be a $Si_3N_4$ layer, and may originate from the formation and patterning of the stack 2 on the substrate 20. A top oxide layer 6 can also be formed as the uppermost layer, which also may originate from the formation of the stack 2, e.g., during lithography. The top oxide layer 6 may for example be a $SiO_2$ layer. Both the upper insulator layer 5 and the top oxide layer 6 may be a $Si_3N_4$ layer and/or a $SiO_2$ layer.

As illustrated in FIG. 2B, in the method according to some embodiments, step a) further can comprise lining the stack 2 with an insulator material 7. This may for example be performed using ALD. The stack 2 may for example be lined with $Si_3N_4$. The lining of the stack 2 may reduce and/or prevent oxidation in some instances. Moreover, as illustrated in FIG. 2C, step a) may further comprise the deposition of the STI oxide 8 and (e.g., subsequent) planarization using e.g., CMP. The STI oxide 8 may be deposited to the lined sidewalls 2c of the stack 2 such that the stack 2 may be held together by the STI oxide 8 during a (e.g., simultaneous) bottom isolation and wall formation of step c). After STI deposition, the formed structure can be planarized. In some examples, it is planarized such that the upper insulator layer 5 is the uppermost layer of the stack 2.

As illustrated in FIGS. 2D-2F, a patterned photoresist layer 9 can be formed atop of the stack such that an opening 10 in the photoresist layer 9 is positioned vertically over the stack 2. The width of the opening 10 can determine the width of the trench that is subsequently formed to divide the stack 2 into the two substacks. In some embodiments, the step of forming the opening 10 can comprise depositing a hardmask layer 14, such as $SiO_2$, on top of the stack 2, and depositing a patterning stack which is used to pattern. As an example, the patterning stack may comprise a SoC layer 15, a SoG layer 16 and an upper photoresist 9 over the hardmask 14, which can be patterned using any suitable photomask. The SoG and the SoC layers can be etched at the position of the opening 10 after removal of the photoresist layer, as illustrated in FIG. 2F.

Figure 2H:
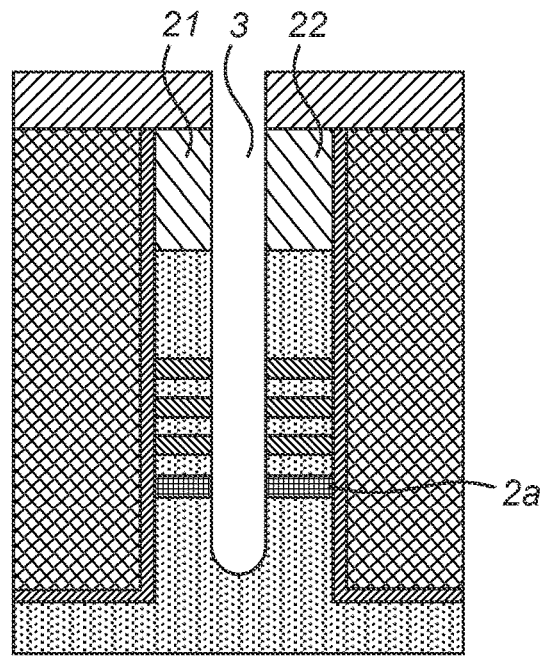

In various implementations, the hardmask 14 and the upper insulator layer 5 can be etched using a suitable hard-mask open (HMO), as illustrated in FIG. 2G, e.g., before etching the trench 3 that divides the stack 2 into two substacks 21, 22, as illustrated in FIG. 2H. The etch through the stacks may be performed using any suitable anisotropic (top-down) etch, and divides the stack 2 into two substacks 21, 22.

Some embodiments as illustrated in FIGS. 2A-2H, step b) can comprise the steps of b11) planarizing the formed structure after STI oxide deposition such that the upper insulator layer 5 above the semiconductor material sheets 2b is the uppermost layer of the stack 2;

b12) forming a patterned photoresist layer 9 over the upper insulator layer 5 such that an opening 10 in the photoresist layer 9 is positioned vertically over the stack 2; and b13) forming a trench 3 through the stack vertically down through the bottom semiconductor nanosheet 2a at the position of the opening 10; thereby separating the stack into two substacks 21,22.

Figure 2I:
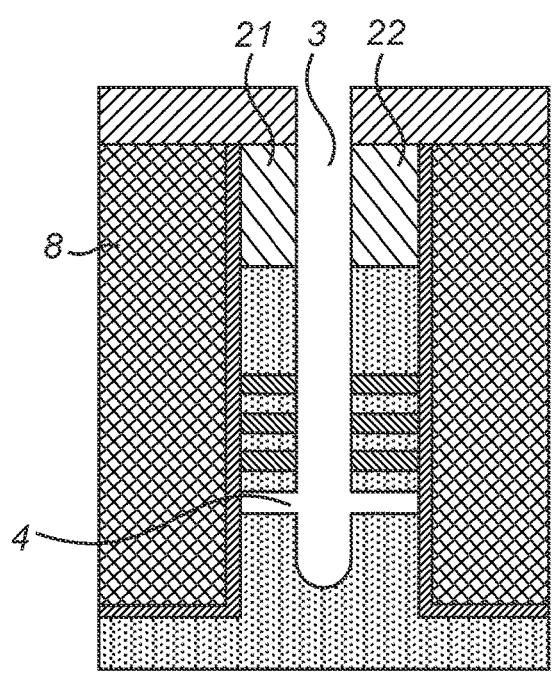
Figure 2J:
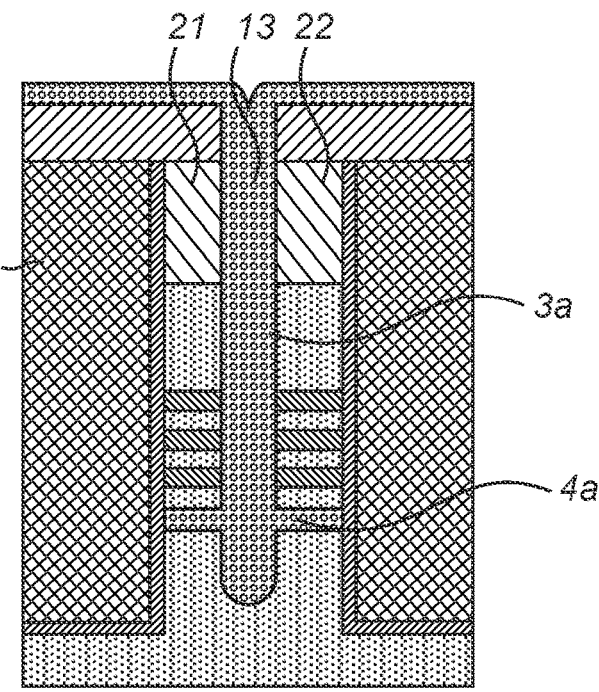
Figure 2K:
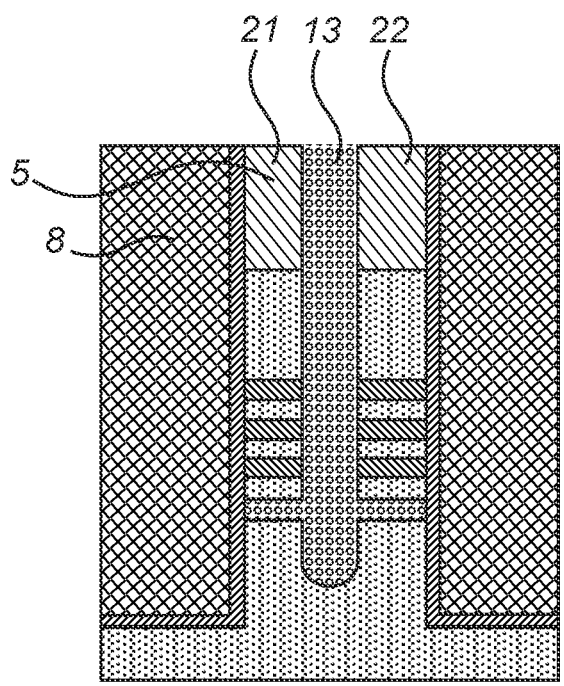

After forming the trench 3, the bottom semiconductor nanosheet 2a can be selectively removed from the stack 2 in a step c) using e.g., etching based on an ammonia hydroxide-hydrogen peroxide-water mixture (APM). This is illustrated in FIG. 2I. After removal of at least a part of the bottom layer 2a, a bottom space 4 is formed under the stack 2, which can extend under both of the substacks 21, 22. As illustrated in FIG. 2J, the bottom space 4 and the trench 3 are filled (e.g., simultaneously in some instances) in a step d) with dielectric material 13 (e.g., the same dielectric material in some instances) to provide a bottom isolation 4a and formation of a dielectric wall 3a between the substacks 21,22. The bottom isolation 4a can be at the filled bottom space 4 and the dielectric wall 3a can be at the position of the previous trench 3. The dielectric material 13 that is deposited to form the bottom isolation 4a and the wall 3a may be selected from the group consisting of $Si_3N_4$, SiCO, and $SiO_2$. The deposited dielectric material 13 may be planarized, as illustrated in FIG. 2K. In some implementations, both substacks 21,22 may be planarized such that the upper dielectric material 5 is the uppermost layer of the stack 2.

Figure 3A:
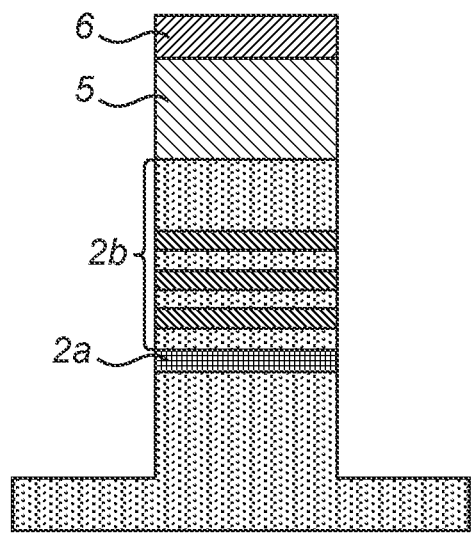
FIGS. 3A-3K illustrate various intermediate structures of a method according to some embodiments of forming a semiconductor device.
Figure 3B:
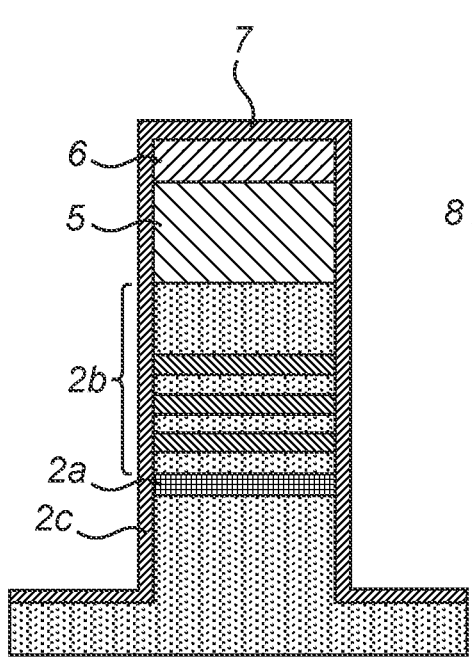
Figure 3C:
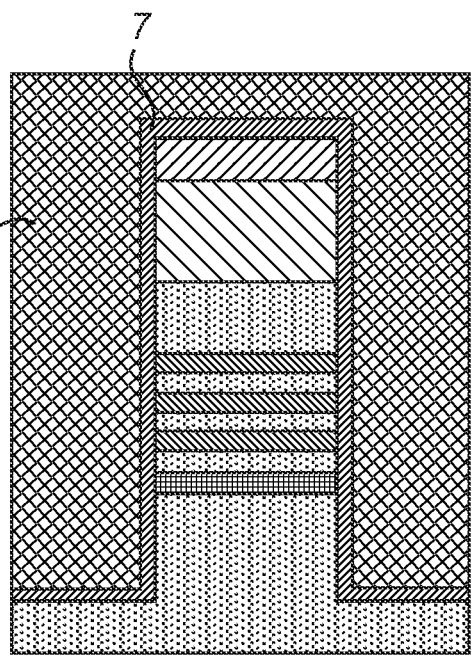
Figures 3D, 3E:
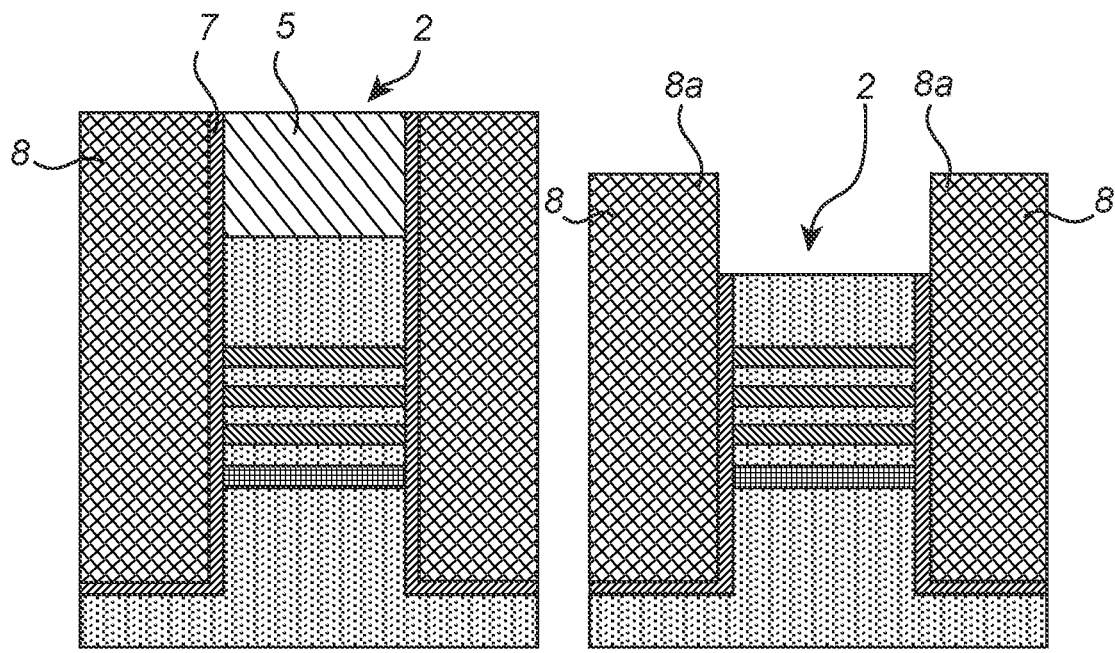
Figures 3F, 3G:
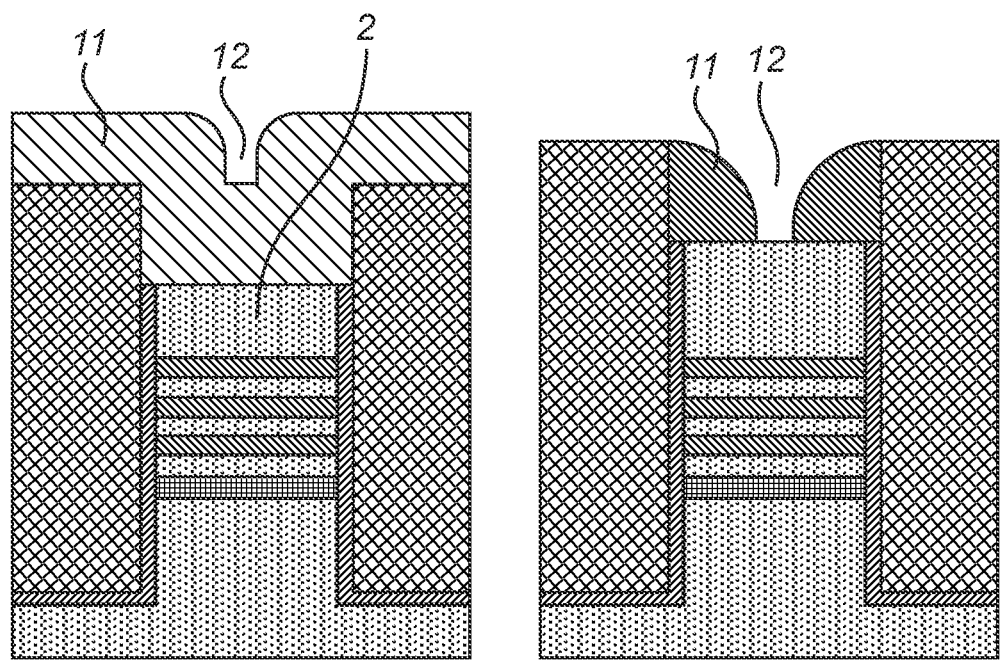
Figure 3H:
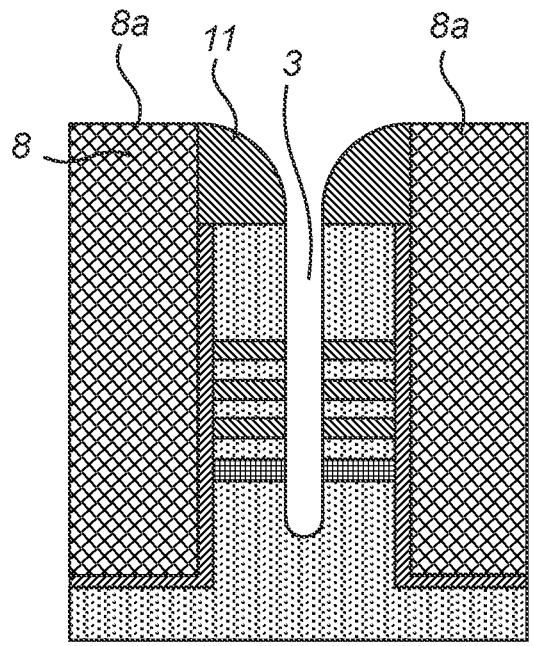

The formation of the trench 3 in some embodiments discussed in relation to FIGS. 2A-2K can be formed by using lithography. However, other methods may be used to form the trench 3. FIGS. 3A-3K illustrate some embodiments with "self-aligned" wall formation. As illustrated in FIGS. 3A-3D, an STI oxide 8 may be deposited after lining the stack with an oxide 7, as discussed in relation to FIGS. 2B and 2C above. In some implementations, before formation of the trench 3, the upper dielectric material 5, such as $Si_3N_4$, may be removed using e.g., phosphoric acid ($H_3PO_4$), as seen in FIG. 3E. In this way, vertically extending sidewalls 8a of the STI oxide 8 can be formed around the remaining stack 2. Spacer material 11 can be deposited (e.g., conformally deposited in some instances) over the stack 2 and the vertically extending sidewalls, as illustrated in FIG. 3F. The spacer material 11 can be deposited using e.g., plasma enhanced atomic layer deposition (PEALD) to an extent such that a horizontal gap 12 is formed between the sidewalls 8a. This gap 12 can be arranged vertically above the stack 2 and can provide and/or define the position of the trench 3 that is subsequently formed through the stack. The deposited spacer material 11 may be etched-back, as seen in FIG. 3G, and a trench may be formed by etching the stack 2 at the position of the gap 12 formed between the deposited spacer material at the sidewalls 8a of the STI oxide 8, as seen in FIG. 3H.

Some embodiments as illustrated in FIGS. 3A-3K, step b) can comprise
- b21) planarizing the formed structure after STI oxide 8 deposition such that the upper insulator layer 5 above the semiconductor material sheets 2b is the uppermost layer of the stack 2;
- b22) removing the upper insulator layer 5 such that the deposited STI oxide 8 forms vertically extending sidewalls 8a at the side of the stack 2;
- b23) depositing spacer material 11 over the stack 2 and at the vertically extending sidewalls 8a, thereby defining a horizontal gap 12 over the stack 2; and
- b24) forming a trench 3 through the stack vertically down through the bottom semiconductor nanosheet 2a at the position of the horizontal gap 12, thereby separating the stack into two substacks.

Figure 3I:
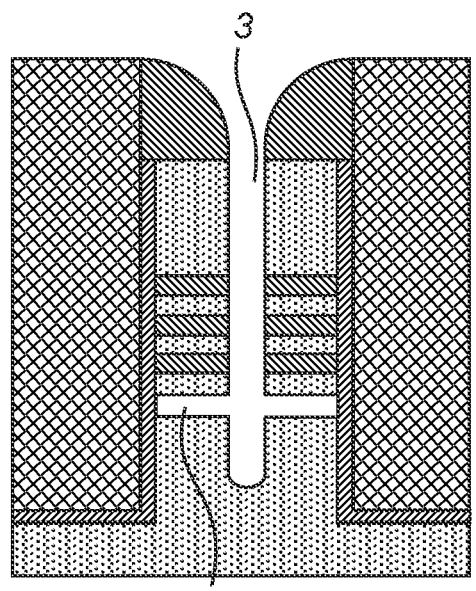
Figure 3J:
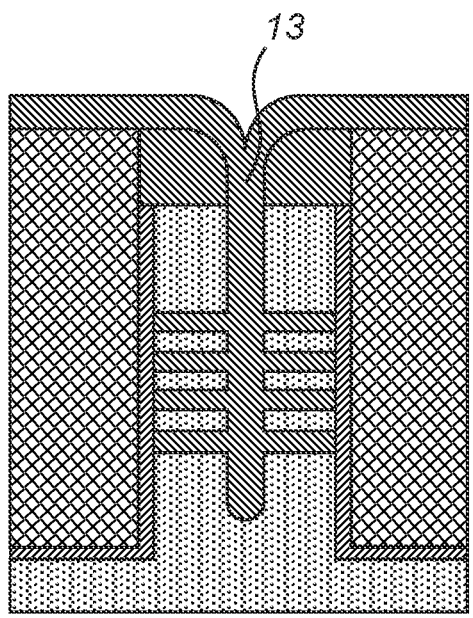
Figure 3K:
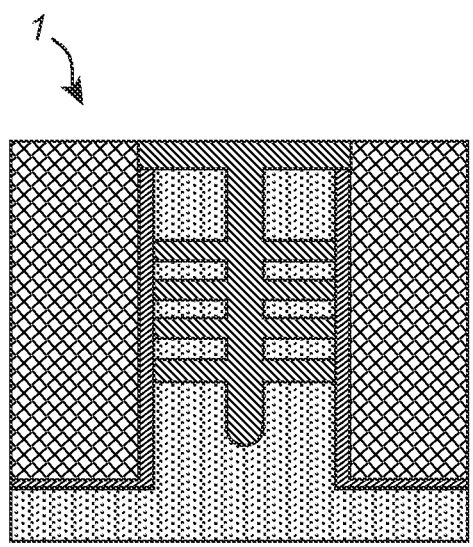

As illustrated in FIGS. 3I-3K, the bottom layer 2a may be selectively removed and the trench and the bottom space 4 may be filled with dielectric material as discussed in relation to FIGS. 2I and 2J above. The formed structure may be planarized, as illustrated in FIG. 3K.

Figure 4E:
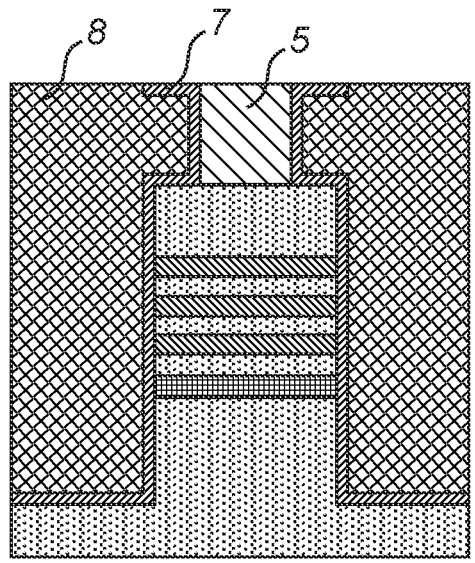

In order to increase the aspect-ratio of the dielectric wall between the two sub stacks, the upper insulator layer may be trimmed before depositing of the STI oxide. Such an embodiment is illustrated in FIGS. 4A-4L, which shows a similar method of forming the trench and the isolation as discussed in relation to FIGS. 3A-3K above, but with an additional step of trimming the upper insulator layer 5, such as an upper $Si_3N_4$, layer, as illustrated in FIG. 4B, before lining the stack with e.g., a $Si_3N_4$ liner, in FIG. 4C. The trimming of the upper insulator layer may be performed using liquid phase or gas phase isotropic etch, such as a dry gas chemical reaction with e.g., hydrofluoric acid (HF) and ammonia ($NH_3$).

Figure 4F:
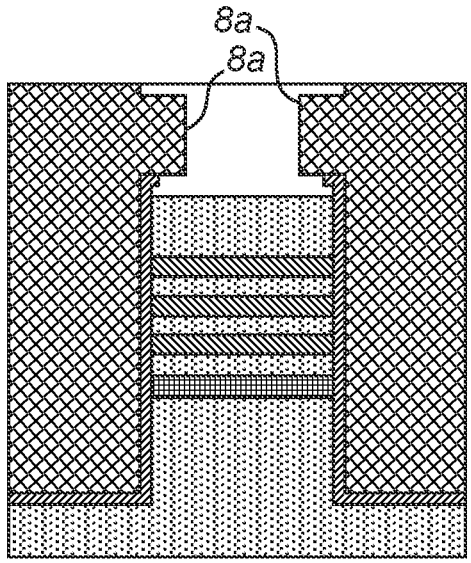

The effect of such a trimming operation is that the subsequent lining with the insulator material 7 (FIG. 4C), deposition of STI oxide 8 (FIG. 4D) and removal of the top insulator layer 5 (FIG. 4E) can result in vertically extending sidewalls 8a of the STI oxide that are arranged closer to each other in the horizontal direction compared to if no trimming is performed, as illustrated in FIG. 4F.

Figure 4G:
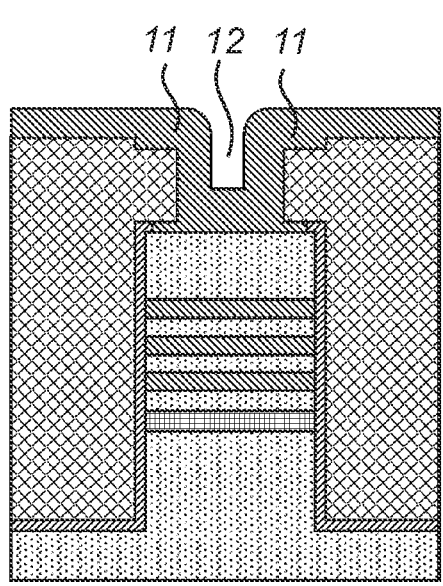
Figure 4H:
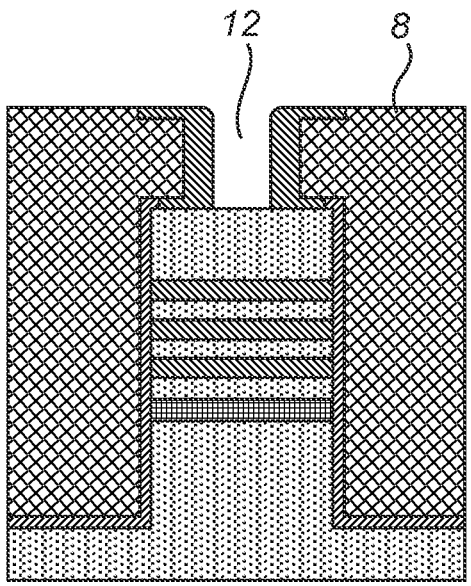
Figure 4I:
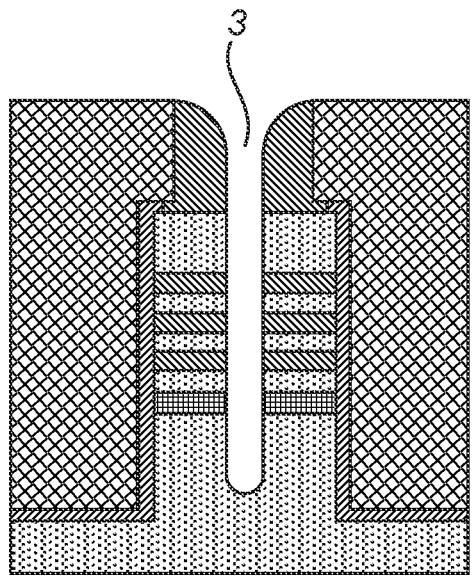
Figure 4J:
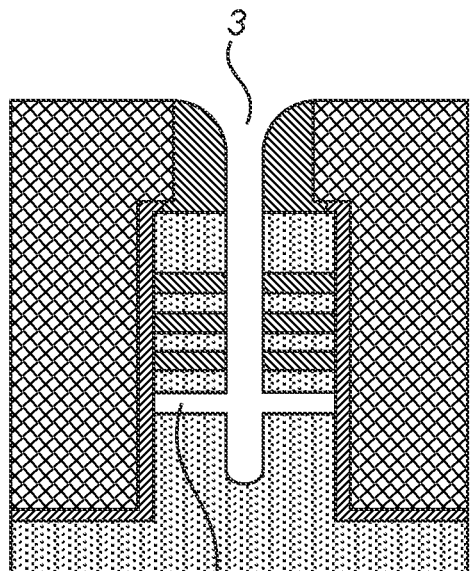
Figure 4K:
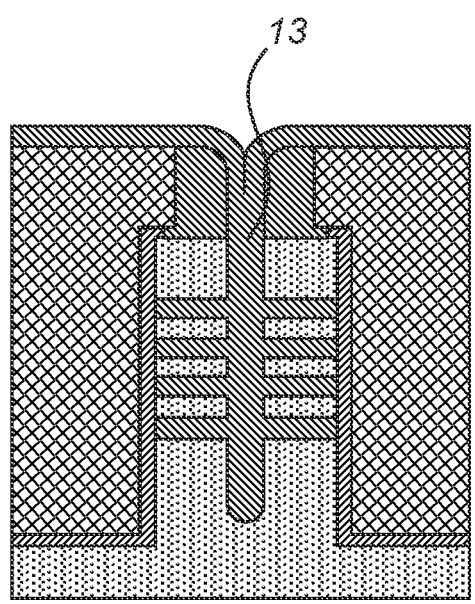
Figure 4L:
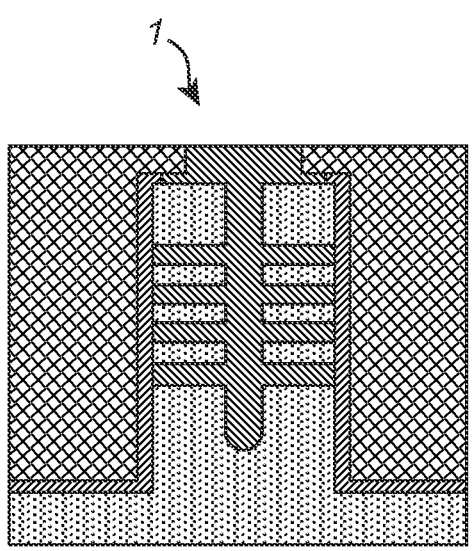

When depositing spacer material 11 over the stack 2 and at the vertically extending sidewalls 8a, as illustrated in FIG. 4G, a thinner spacer in the horizontal direction can be used to define the horizontal gap 12 over the stack 2, as illustrated in FIGS. 4G and 4H.

Figure 5A:
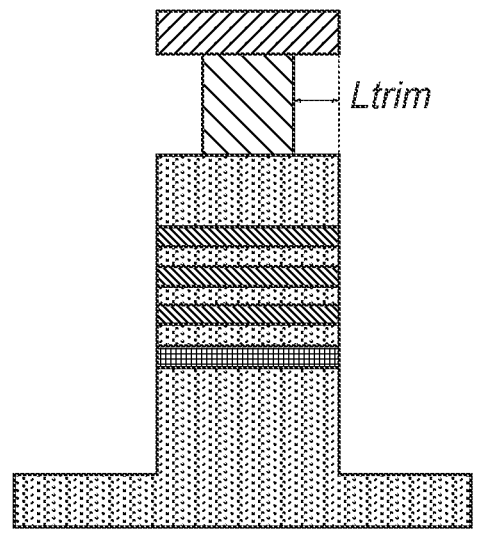
FIGS. 5A-5C illustrate an example semiconductor device with different thickness of the fins.
Figure 5B:
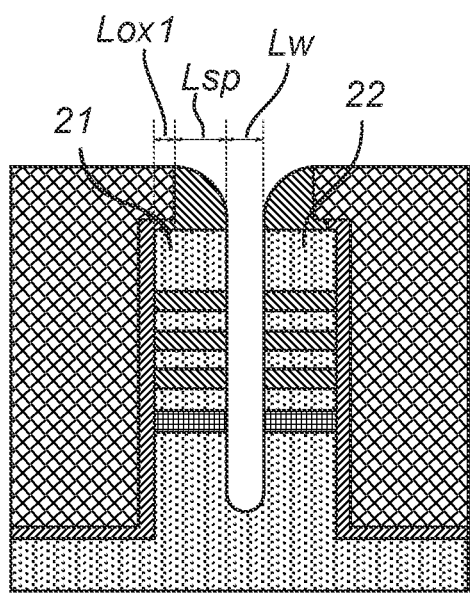
Figure 5C:
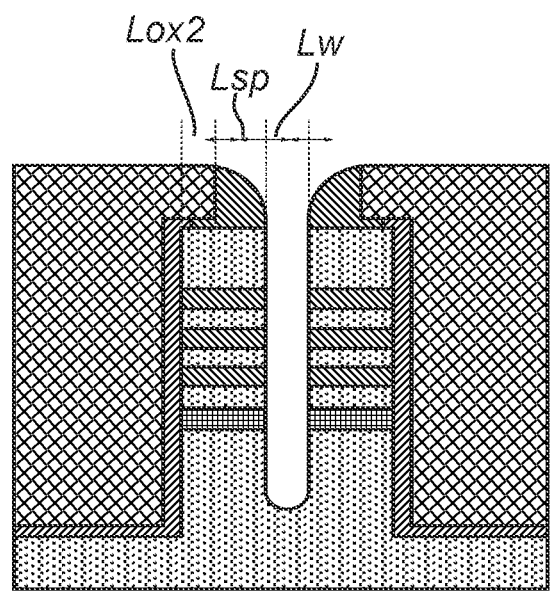

In some implementations, the trimming operation may be used if the stack is wide, e.g., has a larger extension in the horizontal direction. With a wide stack and no trimming, the gap 12 formed after depositing spacer material at the sidewalls may be larger if depositing the same amount of spacer material. Thus, with no trimming, the trench 3 and subsequent wall separating the two substacks may be wider. In some implementations, using a trimming operation of the upper insulator layer 5, a thinner gap 12 and trench 3 may be formed. This can be further illustrated in FIGS. 5A-5C. The width of a substack 21, 22 is the width of the STI oxide over a substack ($L_{ox}$)+ the width of the deposited spacer ($L_{sp}$). $L_{ox}$ may be adjusted by the trimming operation, e.g., the more the upper insulator layer is trimmed, illustrated by $L_{trim}$ in FIG. 5A, the larger $L_{ox}$ becomes after STI deposition. A thin stack is illustrated in FIG. 5B and a wider stack is illustrated in FIG. 5C. In order to maintain the same wall thickness $L_w$ for the larger stack of FIG. 5C with the same spacer thickness $L_{sp}$, a different trimming operation can be performed to increase $L_{trim}$ and thus also $L_{ox2}$. Thus, with a different trimming, the width of the STI oxide over a substack $L_{ox2}$ of the wider stack becomes larger than the width of the STI oxide over a substack $L_{ox1}$ of the thinner stack, as illustrated in FIGS. 5B and 5C.

As shown in FIGS. 4I-4L, formation of trench 3 (FIG. 4I), selective removal of bottom sheet to form bottom space 4 (FIG. 4J), isolation (e.g., simultaneous isolation in various instances) of trench 3 and bottom space 4 with dielectric material 13 (FIG. 4K) and planarization (FIG. 4L) may be performed as discussed in relation to the previous embodiments above.

In various implementations shown in FIGS. 4A-4L, step a) can further comprise trimming the sidewalls 5a of the upper insulator layer 5 such that the upper insulator layer 5 has a width that is smaller than the width of the semiconductor material sheets 2b of the stack 2, e.g., the trimming being performed before lining the stack 2 with an insulator material 7.

While methods and processes may be depicted in the drawings and/or described in a particular order, it is to be recognized that the steps need not be performed in the particular order shown or in sequential order, or that all illustrated steps be performed, to achieve desirable results. Further, other steps that are not depicted may be incorporated in the example methods and processes that are schematically illustrated. For example, one or more additional steps may be performed before, after, simultaneously, or between any of the illustrated steps. Additionally, the steps may be rearranged or reordered in other embodiments.

What is claimed is:

1. A method of forming a semiconducting device, the method comprising:
   forming, on a substrate surface, a stack comprising semiconductor material sheets and a bottom semiconductor nanosheet in the form of a fin;
   forming a trench through the stack vertically down through the bottom semiconductor nanosheet, thereby separating the stack into two substacks;
   selectively removing at least a part of the bottom semiconductor nanosheet, thereby forming a bottom space extending under the substacks; and
   filling the bottom space and the trench with a dielectric material to provide a bottom isolation and formation of a dielectric wall between the substacks.

2. The method according to claim 1, wherein the bottom semiconductor nanosheet comprises SiGe having a Ge content of over 50%.

3. The method according to claim 2, wherein the bottom semiconductor nanosheet is a $Si_{0.35}Ge_{0.65}$ sheet.

4. The method according to claim 2, wherein the semiconductor material sheets comprise SiGe sheets having a Ge content of below 40%.

5. The method according to claim 1, wherein forming the stack further comprises forming an upper insulator layer above the semiconductor material sheets.

6. The method according to claim 5, wherein the upper insulator layer comprises $Si_3N_4$.

7. The method according to claim 5, wherein forming the stack further comprises forming a top oxide layer above the semiconductor material sheets.

8. The method according to claim 5, wherein forming the stack further comprises lining sidewalls of the stack with an insulator material and depositing a shallow trench isolation (STI) oxide on the lined sidewalls of the stack, such that the stack is held together by the STI oxide during selectively removing at least a part of the bottom semiconductor nanosheet.

9. The method according to claim 8, further comprising:
planarizing the formed structure after depositing the STI oxide such that the upper insulator layer above the semiconductor material sheets is the uppermost layer of the stack; and
forming a patterned photoresist layer over the upper insulator layer such that an opening in the photoresist layer is positioned vertically over the stack,
wherein forming the trench through the stack vertically down through the bottom semiconductor nanosheet comprises forming the trench at the position of the opening, thereby separating the stack into the substacks.

10. The method according to claim 8, further comprising:
planarizing the formed structure after depositing the STI oxide such that the upper insulator layer above the semiconductor material sheets is the uppermost layer of the stack;
removing the upper insulator layer such that the deposited STI oxide forms vertically extending sidewalls at sides of the stack; and
depositing a spacer material over the stack and at the vertically extending sidewalls, thereby defining a horizontal gap over the stack,
wherein forming the trench through the stack vertically down through the bottom semiconductor nanosheet is at a position corresponding to the horizontal gap, thereby separating the stack into the substacks.

11. The method according to claim 8, wherein forming the stack further comprises trimming sidewalls of the upper insulator layer such that the upper insulator layer has a width that is smaller than a width of the semiconductor material sheets of the stack, the trimming being performed before lining the stack with the insulator material.

12. The method according to claim 7, wherein the top oxide layer comprises $SiO_2$.

13. The method according to claim 1, wherein the dielectric material is selected from the group consisting of $Si_3N_4$, SiCO, and $SiO_2$.

14. The method according to claim 1, wherein the method further comprises planarizing the substacks.

15. The method according to claim 1, wherein the method further comprises forming gates at least partly around the substacks.

16. The method according to claim 15, wherein forming the gates comprises forming a p-gate at least partly around a first one of the substacks and an n-gate at least partly around a second one of the substacks.

17. The method according to claim 1, wherein the stack comprises a channel material and a sacrificial material.

18. The method according to claim 17, wherein the channel material and the sacrificial material comprise one of silicon, silicon germanium, germanium, a material from group III in the periodic table, or a material from group V in the periodic table.

19. The method according to claim 1, further comprising:
forming a p-type effective work function metal on first and second substacks of the substacks;
selectively removing the p-type effective work function metal from the second substack; and
forming an n-type effective work function metal on the second substack.

20. The method according to claim 19, further comprising forming a first gate electrode in contact with the first substack and a second gate electrode in contact with the second substack.

* * * * *